(12) United States Patent
Izumi

(10) Patent No.: US 7,994,571 B2
(45) Date of Patent: Aug. 9, 2011

(54) SEMICONDUCTOR DEVICE

(75) Inventor: Naoki Izumi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 99 days.

(21) Appl. No.: 12/588,641

(22) Filed: Oct. 22, 2009

(65) Prior Publication Data

US 2010/0102383 A1    Apr. 29, 2010

(30) Foreign Application Priority Data

Oct. 23, 2008   (JP) ................. 2008-273551

(51) Int. Cl.
*H01L 23/62*    (2006.01)
(52) U.S. Cl. ........ 257/330; 257/328; 257/335; 257/341; 257/E21.41
(58) Field of Classification Search ............... 257/330, 257/328, 335, 341, E21.41
See application file for complete search history.

(56) References Cited

U.S. PATENT DOCUMENTS 7,834,407 B2 *  11/2010  Nakazawa et al. ............ 257/401
2006/0157779 A1   7/2006  Kachi et al.

FOREIGN PATENT DOCUMENTS

JP    2006-202931 A    8/2006

\* cited by examiner

*Primary Examiner* — Jack Chen
(74) *Attorney, Agent, or Firm* — Rabin & Berdo, PC

(57) ABSTRACT

An inventive semiconductor device includes: a body region of a second conductivity type provided on the drift region of a first conductivity type in a semiconductor layer; a trench extending from a surface of the body region in the semiconductor layer with its bottom located in the drift region; a gate electrode provided in the trench with the intervention of a gate insulation film; a source region of the first conductivity type provided in a surface layer portion of the body region; a first impurity region of the second conductivity type provided around the bottom of the trench in spaced relation from the body region; and a second impurity region of the second conductivity type provided on a lateral side of the body region in the semiconductor layer, the second impurity region being isolated from the body region and electrically connected to the first impurity region.

12 Claims, 21 Drawing Sheets

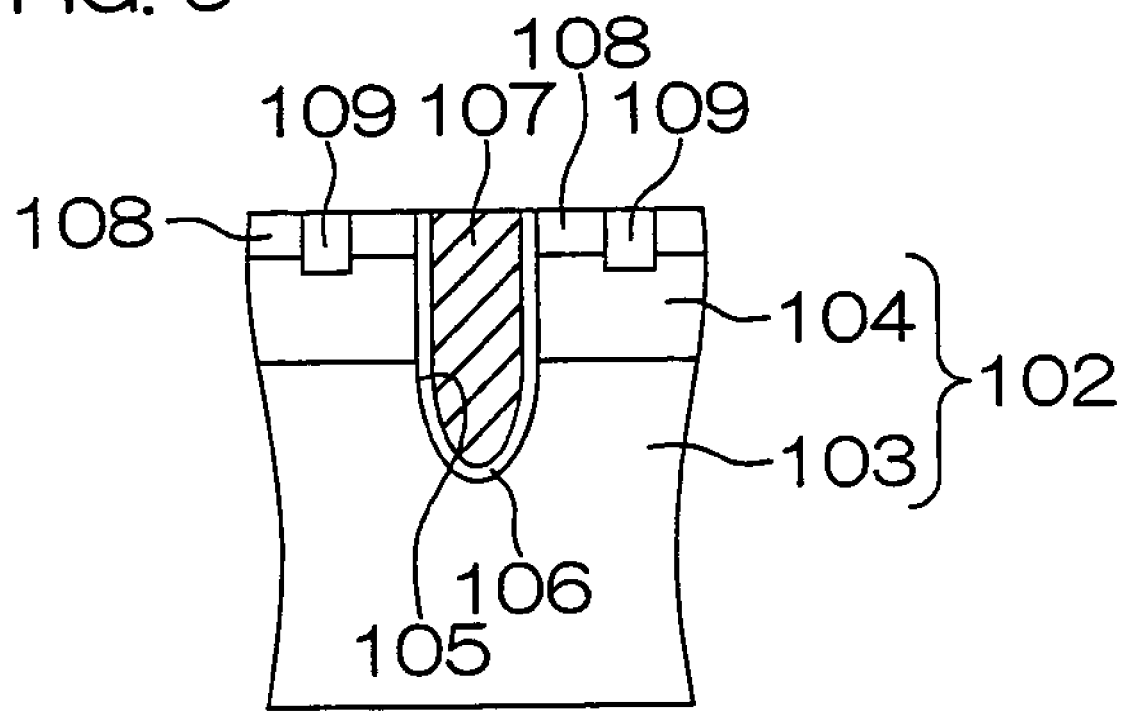

SEMICONDUCTOR DEVICE

BACKGROUND OF THE INVENTION

1. Field of the Invention

The present invention relates to a semiconductor device including a VDMOSFET (vertical double diffused metal oxide semiconductor field effect transistor) of a trench gate type.

2. Description of Related Art

A VDMOSFET (hereinafter referred to as "VDMOS") of a trench gate type is generally known as a power MOSFET having a lower on-resistance characteristic.

FIG. 9 is a schematic sectional view of a prior art semiconductor device including the VDMOS.

The semiconductor device 101 includes a semiconductor layer 102. The semiconductor layer 102 includes an $N^-$-type drift region 103 and a P-type body region 104 disposed in this order from a bottom thereof.

The semiconductor layer 102 has a trench 105. The trench 105 extends through the body region 104 with its bottom located in the drift region 103. A gate insulation film 106 is provided on an interior surface of the trench 105. A gate electrode 107 is provided in the trench 105 with the intervention of the gate insulation film 106.

An $N^+$-type source region 108 and a plurality of $P^+$-type body contact regions 109 are provided in a surface of the body region 104.

A channel is formed in a portion of the body region 104 adjacent to an interface between the body region 104 and the gate insulation film 106 by controlling the potential (gate voltage) of the gate electrode 107 while grounding a source electrode (not shown) electrically connected to a source region 108 and applying a positive voltage to a drain electrode (not shown) electrically connected to the drift region 103. Thus, an electric current flows between the drift region 103 and the source region 108.

If a voltage higher than the rated voltage value of the VDMOS is applied between the source electrode and the drain electrode (between the source and the drain), the highest electric field intensity occurs around the bottom of the trench 105, so that avalanche breakdown occurs around the bottom of the trench 105. Holes generated by the avalanche breakdown flow into the body region 104, and migrate toward the source region 108 in the body region 104. However, draining of the holes from the body region 104 is liable to delay, because the body region 104 has a higher resistance. If a potential difference between the body region 104 and the source region 108 is increased to not lower than the on-voltage of a parasitic NPN transistor defined by the drift region 103, the body region 104 and the source region 108 due to the delay of the draining of the holes, the parasitic NPN transistor is turned on, thereby breaking down the VDMOS due to overcurrent.

SUMMARY OF THE INVENTION

It is an object of the present invention to provide a semiconductor device which includes a VDMOS having an improved avalanche tolerance.

A semiconductor device according to one aspect of the present invention includes: a semiconductor layer; a drift region of a first conductivity type (N-type) provided in the semiconductor layer; a body region of a second conductivity type (P-type) provided on the drift region in the semiconductor layer; a trench extending from a surface of the body region in the semiconductor layer with its bottom located in the drift region; a gate insulation film provided on an interior surface of the trench; a gate electrode provided in the trench with the intervention of the gate insulation film; a source region of the first conductivity type provided in a surface layer portion of the body region on a lateral side of the trench; a first impurity region of the second conductivity type provided around the bottom of the trench in spaced relation from the body region; and a second impurity region of the second conductivity type provided on a lateral side of the body region in the semiconductor layer. The second impurity region is isolated from the body region and electrically connected to the first impurity region.

In the semiconductor device, the drift region of the first conductivity type and the body region of the second conductivity type are provided in this order from a bottom of the semiconductor layer in the semiconductor layer. The source region of the first conductivity type is provided in the surface of the body region. The trench is provided in the semiconductor layer. The trench extends through the body region with its bottom located in the drift region. The gate electrode is provided in the trench with the intervention of the gate insulation film. The first impurity region of the second conductivity type is provided around the bottom of the trench in spaced relation from the body region. Further, the second impurity region of the second conductivity type is provided on the lateral side of the body region in the semiconductor layer so as to be isolated from the body region. The first impurity region and the second impurity region are electrically connected to each other.

When a voltage higher than the rated voltage value of the VDMOS is applied between the source region and the drift region, the highest electric field intensity occurs at the deepest portion of the first impurity region, and the avalanche breakdown occurs around the deepest portion of the first impurity region. Holes generated by the avalanche breakdown are drained from the first impurity region via the second impurity region. This prevents the holes from flowing into the body region, thereby preventing the turn-on of a parasitic transistor defined by the drift region, the body region and the source region. Thus, the avalanche tolerance of the VDMOS can be improved.

The second impurity region may extend from the surface of the semiconductor layer to a depth such as to reach the first impurity region. Alternatively, the second impurity region may have the same depth as the body region, and a buried impurity region of the second conductivity type connected to the first impurity region and the second impurity region may be provided below the second impurity region.

Where the second impurity region has a depth such as to reach the first impurity region, the step of forming the buried impurity region is obviated without the need for forming the buried impurity region.

On the other hand, where the buried impurity region is to be provided, the step of forming the buried impurity region is required, but the second impurity region and the body region can be formed in the same step. This simplifies the production process.

The second impurity region is preferably looped so as to surround the body region. In this case, the second impurity region functions as a guard ring for the VDMOS.

The trench may include a plurality of parallel portions which extend parallel to each other in a predetermined direction, and a connection portion which extends perpendicularly to the predetermined direction and connects one-end portions of the respective parallel portions. That is, the semiconductor device includes a plurality of VDMOSs connected in parallel. In this case, it is possible to prevent breakdown of the VDMOSs due to the avalanche breakdown, thereby improving the avalanche tolerances of the respective VDMOSs.

The semiconductor device may further include a plug connected to a surface of the second impurity region, and an interconnection connected to the plug.

In this case, the plug preferably includes a plurality of plugs arranged in spaced relation in a direction in which the connection portion extends, and the interconnection is preferably connected commonly to the plurality of plugs. Since the plurality of plugs share the interconnection, the interconnection arrangement is simplified as compared with a case in which the plugs are respectively connected to different interconnections.

Further, a contact region having a higher impurity concentration than the second impurity region is preferably provided in a surface layer portion of the second impurity region. Thus, the electrical connection between the plug and the second impurity region can be properly achieved.

Where the second impurity region is looped to surround the body region, the second impurity region can function as a guard ring for the VDMOS with the interconnection being grounded.

Further, a body contact region having a higher impurity concentration than the body region is preferably provided in the surface layer portion of the body region as extending thicknesswise through the source region.

In this case, the body contact region may include a plurality of body contact regions arranged in spaced relation in a direction in which the parallel portions extend.

Where the plurality of body contact regions are provided, source plugs may be provided in association with the respective body contact regions. The source plugs are each connected to the corresponding body contact region and a part of the source region around the body contact region.

In this case, a source interconnection is preferably connected commonly to the plurality of source plugs. This simplifies an interconnection arrangement as compared with a case in which the source plugs are respectively connected to different interconnections.

The foregoing and other objects, features and effects of the present invention will become more apparent from the following detailed description of the embodiments with reference to the attached drawings.

BRIEF DESCRIPTION OF THE DRAWINGS

FIG. 9 is a schematic sectional view of a prior-art semiconductor device including a VDMOS.

DETAILED DESCRIPTION OF PREFERRED EMBODIMENTS

Figure 1:
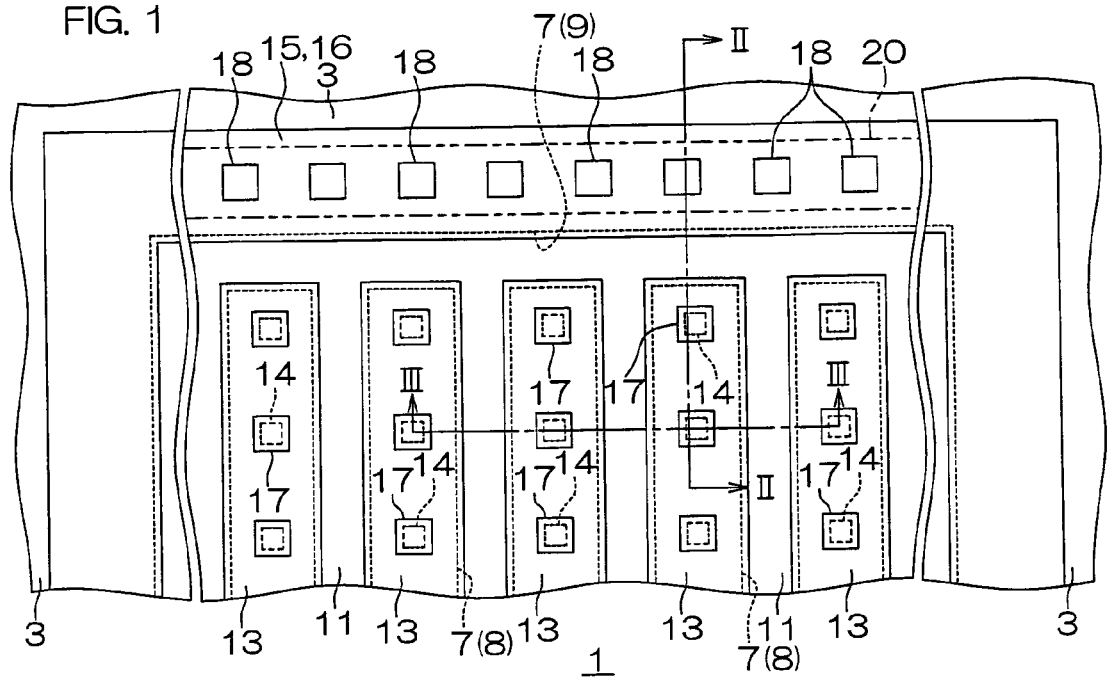
FIG. 1 is a schematic plan view of a semiconductor device according to a first embodiment of the present invention.
Figure 2:
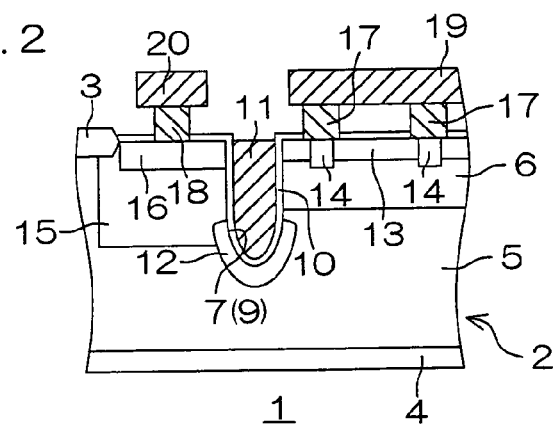
FIG. 2 is a sectional view of the semiconductor device taken along a section line II-II in FIG. 1.
Figure 3:
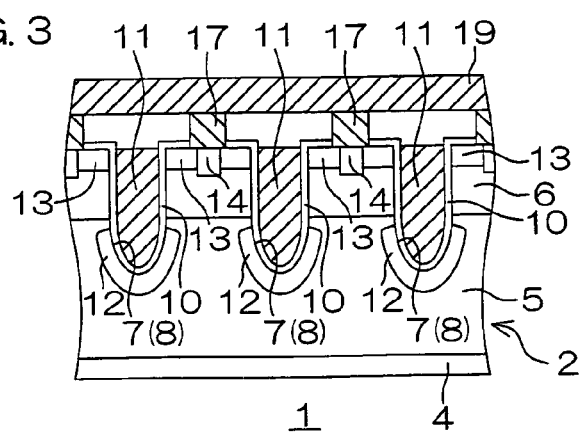
FIG. 3 is a sectional view of the semiconductor device taken along a section line III-III in FIG. 1.

FIG. 1 is a schematic plan view of a semiconductor device according to a first embodiment of the present invention. FIG. 2 is a sectional view of the semiconductor device taken along a section line II-II in FIG. 1. FIG. 3 is a sectional view of the semiconductor device taken along a section line III-III in FIG. 1.

As shown in FIGS. 2 and 3, the semiconductor device 1 includes a semiconductor layer 2. The semiconductor layer 2 is composed of, for example, silicon. As shown in FIG. 1, a looped field oxide film (e.g., a silicon oxide film formed by a LOCOS (local-oxidation-of-silicon) method) 3 is provided in a surface of the semiconductor layer 2. The field oxide film 3 isolates a region surrounded by the field oxide film 3 from a region outside the field oxide film 3. A plurality of VDMOSs connected in parallel are provided in the region surrounded by the field oxide film 3.

As shown in FIGS. 2 and 3, the semiconductor layer 2 includes an $N^{++}$-type drain region 4 (having a higher N-type impurity concentration than a source region 13 to be described later), an N-type drift region 5 and a P-type body region 6 provided in this order from a bottom thereof. As shown in FIG. 1, the body region 6 is disposed in a center of the region surrounded by the field oxide film 3.

The semiconductor layer 2 has a comb-shaped trench 7 as seen in plan. More specifically, the trench 7 includes a plurality of parallel portions 8 extending parallel to each other in a predetermined direction, and a connection portion 9 extending perpendicularly to the predetermined direction and connecting one-end portions of the respective parallel portions 8. As shown in FIGS. 2 and 3, the trench 7 (the parallel portions 8 and the connection portion 9) extends through the body region 6 from a surface of the body region 6 with its bottom located in the drift region 5.

A gate insulation film 10 of $SiO_2$ (silicon oxide) is provided on an interior surface of the trench 7. A gate electrode 11 of a doped polysilicon (e.g., a polysilicon doped with an N-type impurity) is provided in the trench 7 with the intervention of the gate insulation film 10.

A first impurity region 12 of $P^+$-type (having a higher P-type impurity concentration than the body region 6) is provided around the bottom of the trench 7. The first impurity region 12 is spaced from the body region 6.

An $N^+$-type source region 13 (having a higher N-type impurity concentration than the drift region 5) and a plurality of $P^+$-type body contact regions 14 are provided in a surface layer portion of the body region 6. The source region 13 covers the surface layer portion of the body region 6 except for the body contact regions 14. The body contact regions 14 are arranged at a regular interval alongside the parallel portions 8 of the trench 7 in spaced relation from the trench 7.

As shown in FIGS. 1 and 3, a second impurity region 15 of P-type is provided between the field oxide film 3 and the trench 7 in a peripheral portion of the region of the semiconductor layer 2 surrounded by the field oxide film 3, i.e., in a looped region around the body region 6. As shown in FIGS. 2 and 3, the second impurity region 15 has a greater depth than the deepest portion of the body region 6 as measured from the surface of the semiconductor layer 2. The deepest portion of the second impurity region 15 is connected to the first impurity region 12 provided around the bottom of the connection portion 9 of the trench 7.

A P$^+$-type contact region 16 is provided in a surface layer portion of the second impurity region 15.

It is noted that an oxide film of SiO$_2$ is provided over the body region 6 and the second impurity region 15. The oxide film on the body region 6 and the second impurity region 15 is unitary with the gate insulation film 10.

An interlayer dielectric film (not shown) is provided on the semiconductor layer 2 as covering the entire surface of the semiconductor layer 2. Plugs 17 are embedded in the interlayer dielectric film to be disposed in association with the respective body contact regions 14. The plugs 17 each extend through the interlayer dielectric film to be connected to both the corresponding body contact region 14 and a portion of the source region 13 around the body contact region 14 (through butting contact). Further, a plurality of plugs 18 are embedded in the interlayer dielectric film as being spaced a predetermined distance from each other in a direction in which the connection portion 9 of the trench 7 extends. The plugs 18 each extend through the interlayer dielectric film to be connected to the contact region 16. A source interconnection 19 connected commonly to the plugs 17 and a drain interconnection 20 connected commonly to the plugs 18 are provided on the interlayer dielectric film. The source interconnection 19 and the drain interconnection 20 are grounded.

It is noted that the source interconnection 19 is not shown in FIG. 1.

A drain electrode (not shown) is provided on a back surface of the semiconductor layer 2. A channel is formed in a portion of the body region 6 adjacent to an interface between the gate insulation film 10 and the body region 6 by controlling the potential (gate voltage) of the gate electrode 11 while applying a positive voltage having a proper magnitude to the drain electrode. Thus, an electric current flows between the drain region 4 and the source region 13.

FIGS. 4A to 4M and FIGS. 5A to 5M are schematic sectional views showing a process sequence for production of the semiconductor device shown in FIGS. 2 and 3. The sectional views of FIGS. 4A to 4M and FIG. 2 are taken along the same sectional plane. The sectional views of FIGS. 5A to 5M and FIG. 3 are taken along the same sectional plane.

Figure 4A:
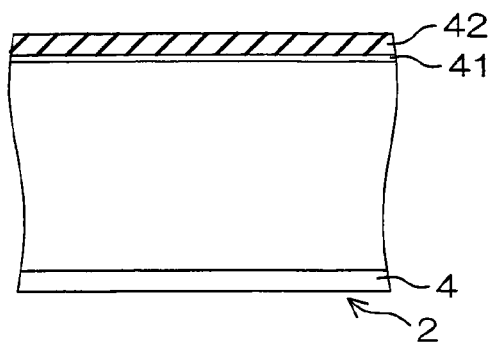
FIGS. 4A to 4M are schematic sectional views showing a process sequence for production of the semiconductor device of FIG. 2.
Figure 5A:
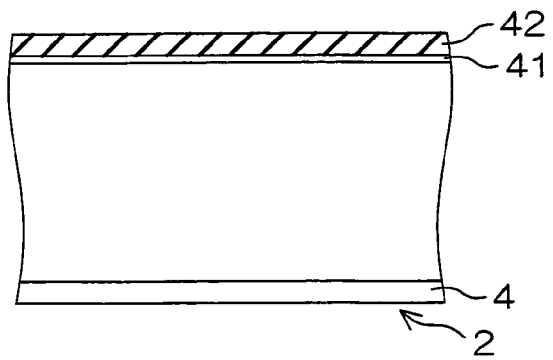
FIGS. 5A to 5M are schematic sectional views showing the process sequence for the production of the semiconductor device of FIG. 3.

In the production process for the semiconductor device 1, as shown in FIGS. 4A and 5A, an oxide film 41 of SiO$_2$ is formed in a surface of a semiconductor layer 2 having a drain region 4 provided in a bottom portion thereof by a thermal oxidation method. Then, a nitride film 42 of SiN (silicon nitride) is formed on the oxide film 41 by an LPCVD (low pressure chemical vapor deposition) method.

Figure 4B:
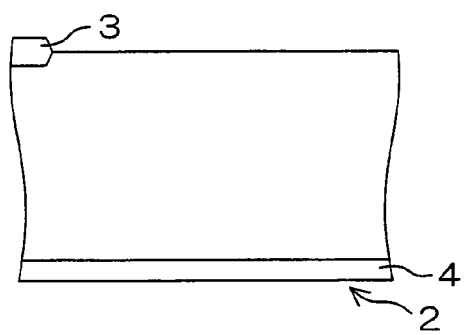
Figure 5B:
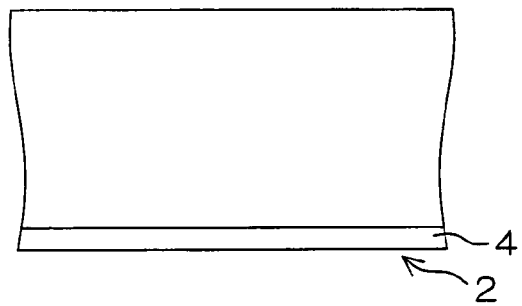

Thereafter, a resist pattern is formed on the nitride film 42 by photolithography, and the oxide film 41 and the nitride film 42 are selectively etched away by using the resist pattern as a mask. Then, a heat treatment is performed. Thus, as shown in FIG. 4B, a field oxide film 3 is formed in the surface of the semiconductor layer 2. That is, the field oxide film 3 is formed in the surface of the semiconductor layer 2 by a LOCOS method in the steps shown in FIGS. 4A, 4B, 5A and 5B. After the heat treatment, as shown in FIGS. 4B and 5B, the oxide film 41 and the nitride film 42 are removed.

Figure 4C:
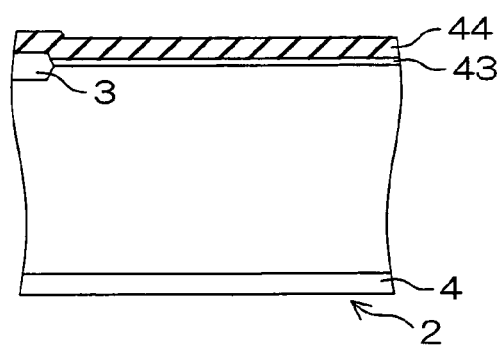
Figure 5C:
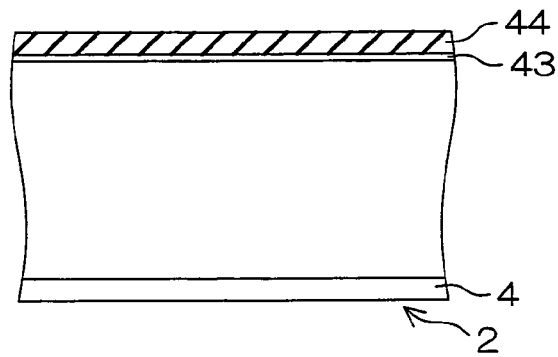

Subsequently, as shown in FIGS. 4C and 5C, a pad oxide film 43 of SiO$_2$ is formed in the surface of the semiconductor layer 2 by a thermal oxidation method. Further, a nitride film 44 is formed on the pad oxide film 43 by an LPCVD method.

Figure 4D:
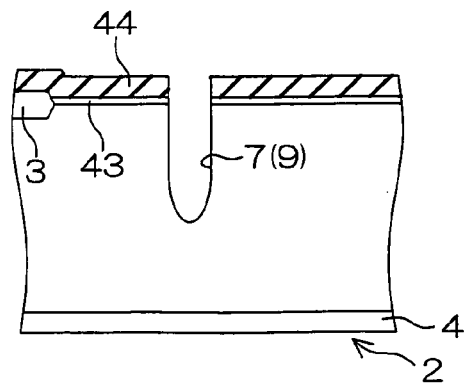
Figure 5D:
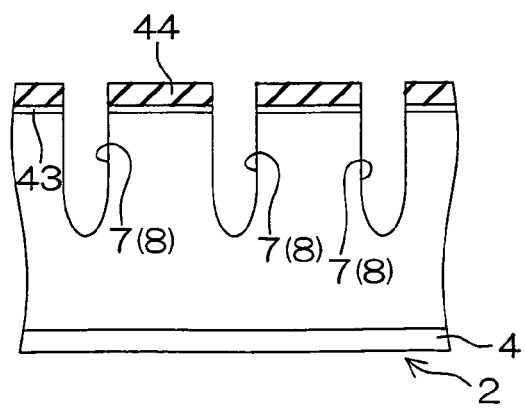

In turn, as shown in FIGS. 4D and 5D, the pad oxide film 43 and the nitride film 44 are selectively removed by a photolithography and etching process. Then, a part of the semiconductor layer 2 is etched away by employing the pad oxide film 43 and the nitride film 44 as a mask, whereby a trench 7 is formed.

Figure 4E:
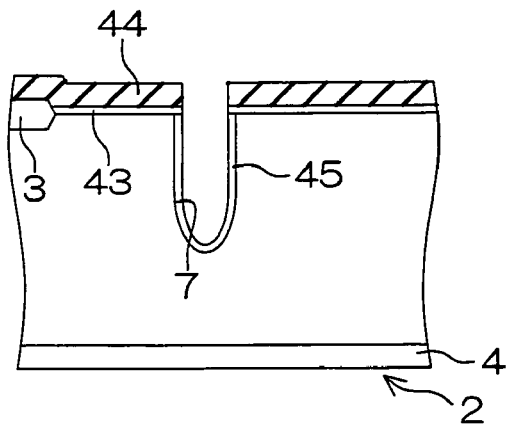
Figure 5E:
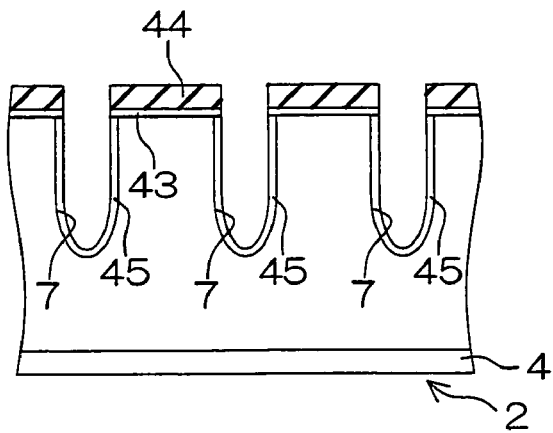

Thereafter, as shown in FIGS. 4E and 5E, a sacrificial oxide film 45 of SiO$_2$ is formed on an interior surface of the trench 7 by a thermal oxidation method. The pad oxide film 43 and the nitride film 44 are not removed but remain.

Figure 4F:
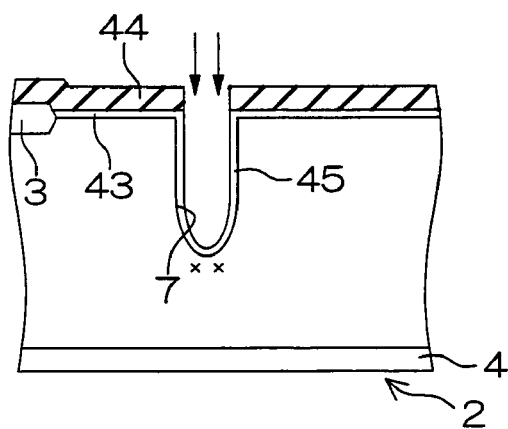
Figure 5F:
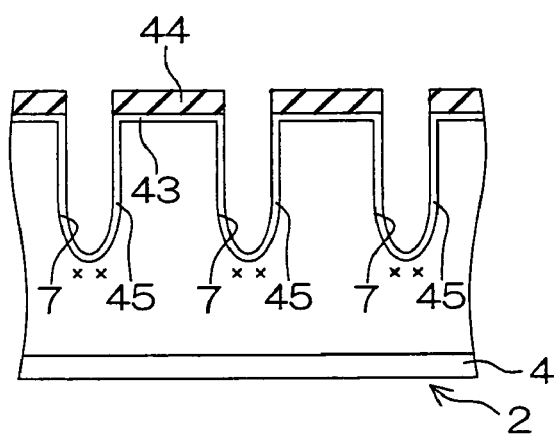

Then, as shown in FIGS. 4F and 5F, a P-type impurity (e.g., boron) is implanted into a portion of the semiconductor layer 2 around a bottom of the trench 7 through the trench 7 by an ion implantation method employing the pad oxide film 43 and the nitride film 44 as a mask.

Figure 4G:
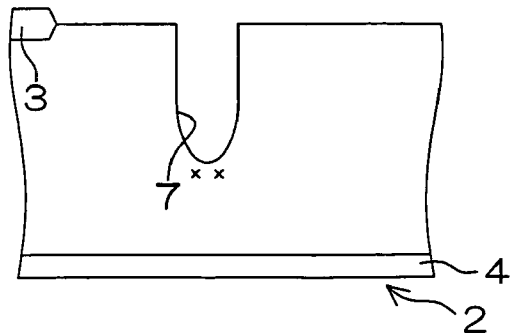
Figure 5G:
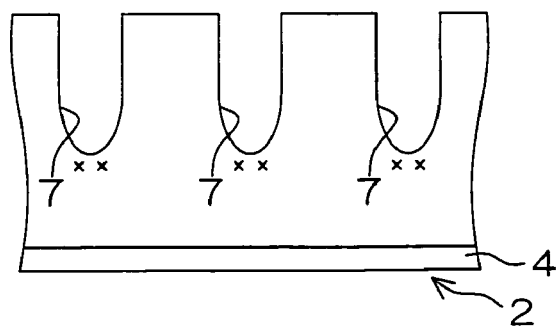

In turn, as shown in FIGS. 4G and 5G, the sacrificial oxide film 45, the nitride film 44 and the pad oxide film 43 are removed in this order.

Figure 4H:
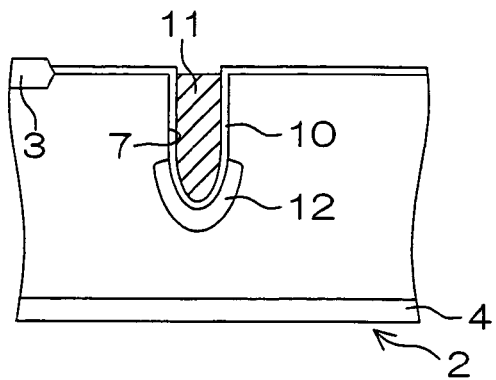
Figure 4:
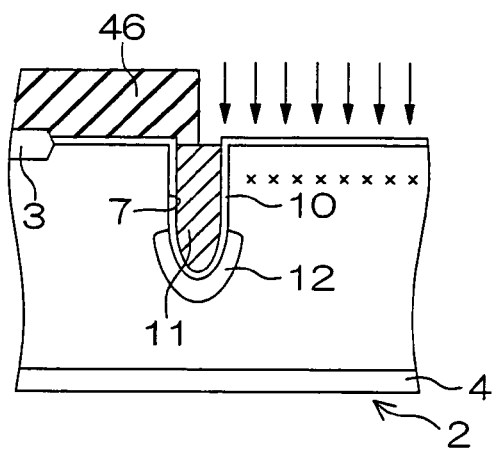
Figure 4:
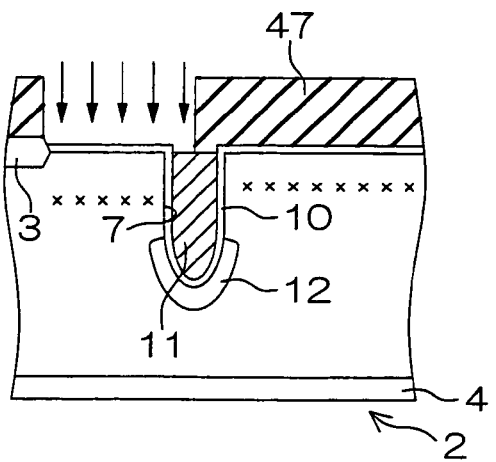
Figure 5H:
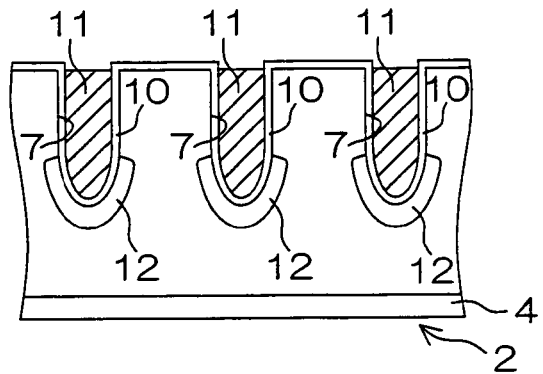

Then, as shown in FIGS. 4H and 5H, an oxide film of SiO$_2$ is formed in a surface of the semiconductor layer 2 including the interior surface of the trench 7 by a thermal oxidation method. A part of the oxide film present on the interior surface of the trench 7 serves as a gate insulation film 10. At this time, a heat treatment for the thermal oxidation diffuses the P-type impurity implanted into the semiconductor layer 2 to form a first impurity region 12 around the bottom of the trench 7. Thereafter, a doped polysilicon is deposited over the semiconductor layer 2 by CVD (Chemical Vaper Deposition) so as to fill the trench 7. Then, the deposited doped polysilicon is etched back to form a gate electrode 11 in the trench 7 with the intervention of the gate insulation film 10.

Figure 5I:
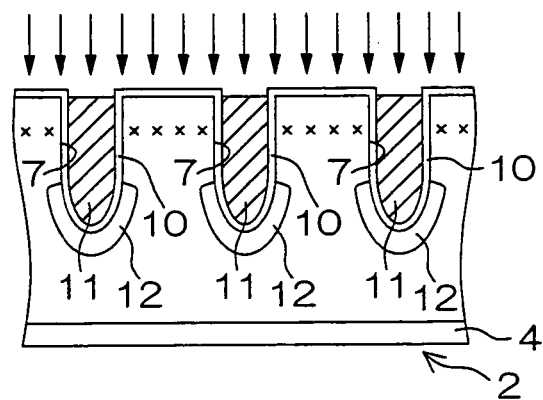

After the formation of the gate electrode 11, as shown in FIGS. 4I and 5I, a resist pattern 46 having an opening through which a center portion of a region surrounded by the field oxide film 3 is selectively exposed is formed by photolithography. Then, a P-type impurity is implanted into the center portion of the region surrounded by the field oxide film 3 by an ion implantation method employing the resist pattern 46 as a mask. After the implantation of the P-type impurity, the resist pattern 46 is removed.

Figure 5J:
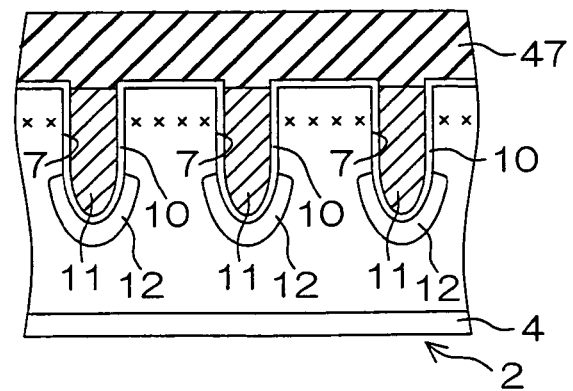

In turn, as shown in FIGS. 4J and 5J, a resist pattern 47 having an opening through which a peripheral portion of the region surrounded by the field oxide film 3 is selectively exposed is formed by photolithography. Then, a P-type impurity is implanted into the peripheral portion of the region surrounded by the field oxide film 3 by an ion implantation method employing the resist pattern 47 as a mask. At this time, an ion implantation energy is greater than that employed for implanting the P-type impurity into the center portion of the region surrounded by the filed oxide film 3, so that the P-type impurity is implanted to a greater depth in the peripheral portion than in the center portion of the region surrounded by the filed oxide film 3. After the implantation of the P-type impurity, the resist pattern 47 is removed.

Figure 4K:
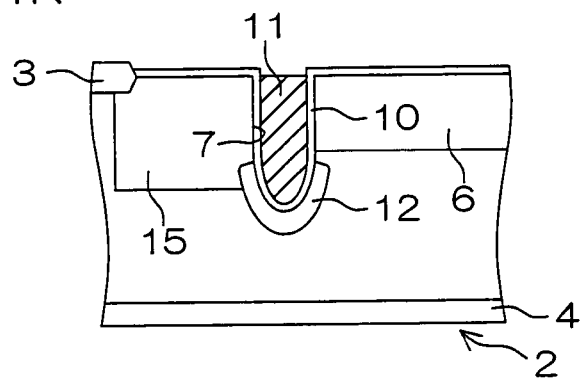
Figure 5K:
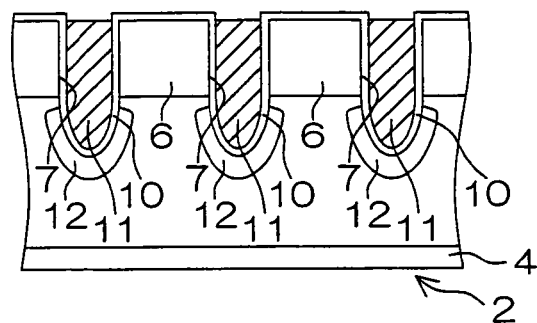

In turn, a heat treatment is performed to diffuse (drive) the P-type impurity implanted into the region surrounded by the field oxide film 3. By the diffusion of the P-type impurity, as shown in FIGS. 4K and 5K, a body region 6 is formed in the center portion of the region surrounded by the field oxide film 3 in the semiconductor layer 2, and a second impurity region 15 is formed in the peripheral portion of the region surrounded by the field oxide film 3 in the semiconductor layer 2.

Figure 4L:
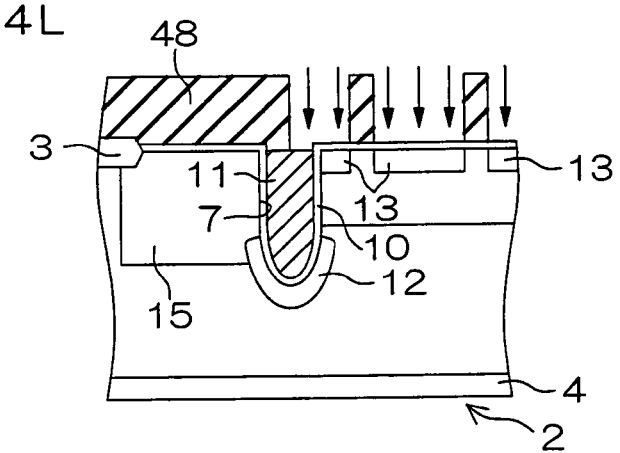
Figure 5L:
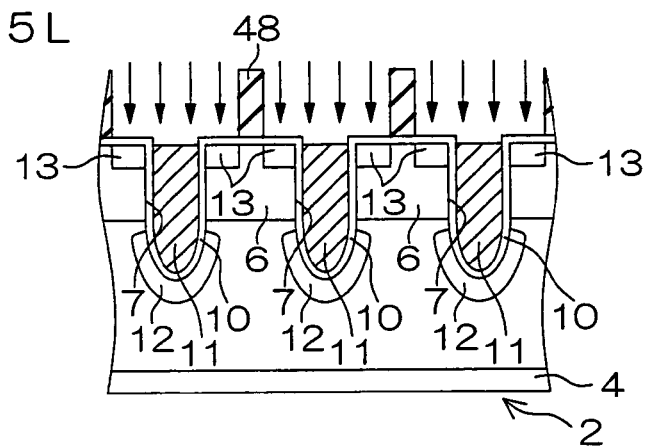

Thereafter, as shown in FIGS. 4L and 5L, a resist pattern 48 is formed on the semiconductor layer 2 by photolithography. Then, an N-type impurity (e.g., arsenic) is implanted into a portion of the semiconductor layer 2 exposed from the resist pattern 48 by employing the resist pattern 48 as a mask. Thus, a source region 13 is formed. After the implantation of the N-type impurity, the resist pattern 48 is removed.

Figure 4M:
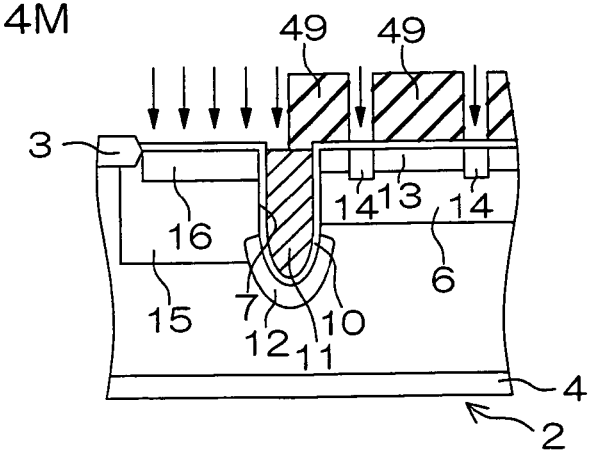
Figure 5M:
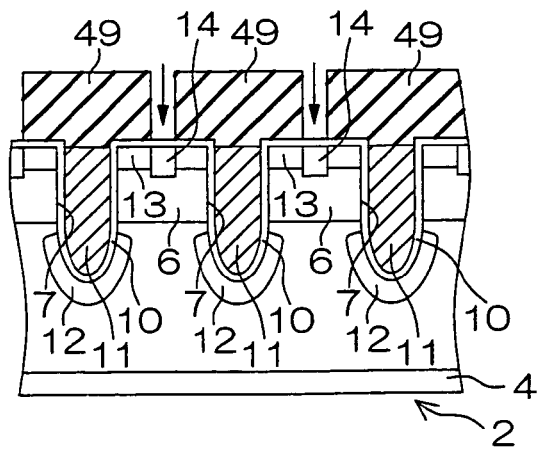

Further, as shown in FIGS. 4M and 5M, a resist pattern 49 is formed on the semiconductor layer 2. Then, a P-type impurity is implanted into portions of the semiconductor layer 2 exposed from the resist pattern 49 by an ion implantation method employing the resist pattern 49 as a mask. Thus, body contact regions 14 and a contact region 16 are formed. After the implantation of the P-type impurity, the resist pattern 49 is removed.

Thereafter, an interlayer dielectric film is formed on the semiconductor layer 2, and then plugs 17, 18, a source interconnection 19 and a drain interconnection 20 are formed. Thus, the semiconductor device 1 shown in FIG. 1 is obtained.

When a voltage higher than the rated voltage values of the VDMOSs is applied between the source region 13 and the drift region 5 (drain region 4) in the semiconductor device 1, a higher electric field intensity occurs at the deepest portion of the first impurity region 12, whereby avalanche breakdown occurs around the deepest portion of the first impurity region 12. Holes generated by the avalanche breakdown are drained from the first impurity region 12 via the second impurity region 15 and the drain interconnection 20. This prevents the holes from flowing into the body region 6, thereby preventing the turn-on of a parasitic transistor defined by the drift region 5, the body region 6 and the source region 13. Thus, the avalanche tolerances of the respective VDMOSs can be improved.

Further, the second impurity region 15 is looped to surround the body region 6 and, therefore, functions as a guard ring for the VDMOSs. Since the drain interconnection 20 electrically connected to the second impurity region 15 via the plugs 18 is grounded, the second impurity region 15 functions as the guard ring for the VDMOSs in the semiconductor device 1.

Figure 6:
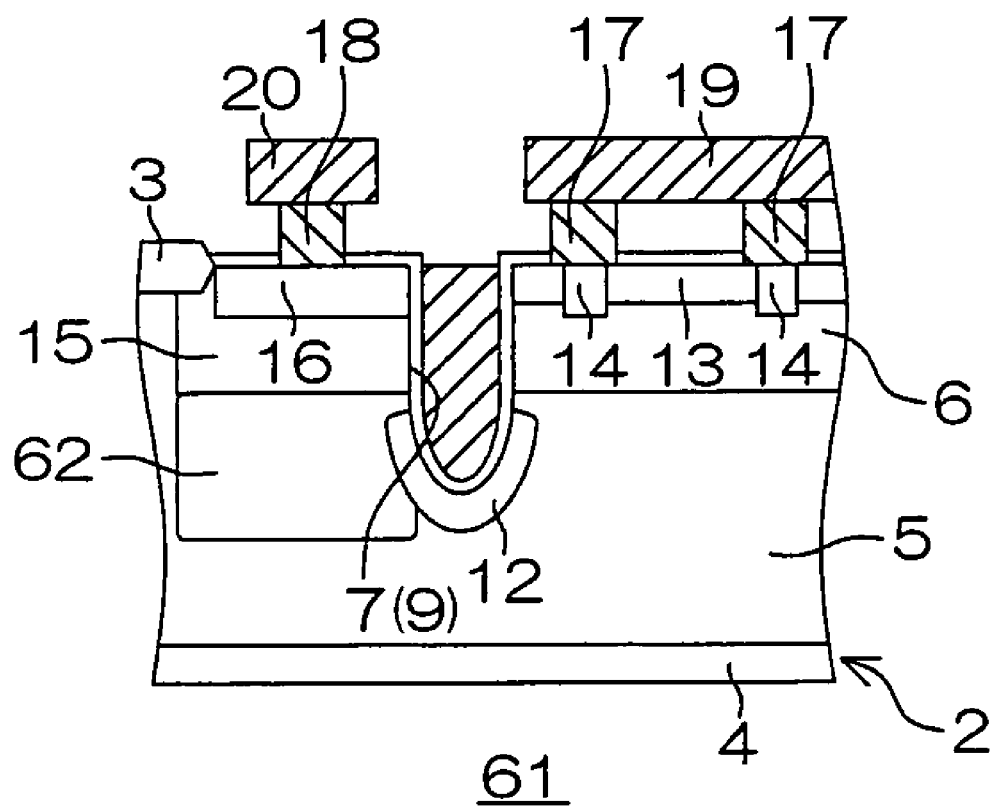
FIG. 6 is a schematic sectional view showing the construction of a semiconductor device according to a second embodiment of the present invention.

FIG. 6 is a schematic sectional view showing the construction of a semiconductor device according to a second embodiment of the present invention. In FIG. 6, components corresponding to those shown in FIG. 2 are denoted by the same reference characters as in FIG. 2. Further, the semiconductor device shown in FIG. 6 has the same plan view as the semiconductor device shown in FIG. 2, i.e., the same plan view as shown in FIG. 1. FIG. 6 is taken along the same sectional plane as shown FIG. 2. Hereinafter, only differences in construction between the semiconductor device shown in FIG. 6 and the semiconductor device shown in FIG. 2 will be described, and no description will be given to components denoted by the same reference characters.

In the semiconductor device 61 shown in FIG. 6, the second impurity region 15 has the same depth as the body region 6. A buried impurity region 62 of P-type is provided below the second impurity region 15. The buried impurity region 62 is connected to the second impurity region 15 as well as to the first impurity region 12. Thus, holes generated by the avalanche breakdown flow into the buried impurity region 62 from the first impurity region 12, and drained from the buried impurity region 62 via the second impurity region 15 and the drain interconnection 20. As in the semiconductor device 1 shown in FIG. 2, this prevents the holes from flowing into the body region 6, thereby preventing the turn-on of the parasitic transistor defined by the drift region 5, the body region 6 and the source region 13. As a result, the avalanche tolerances of the respective VDMOSs can be improved.

Figure 7A:
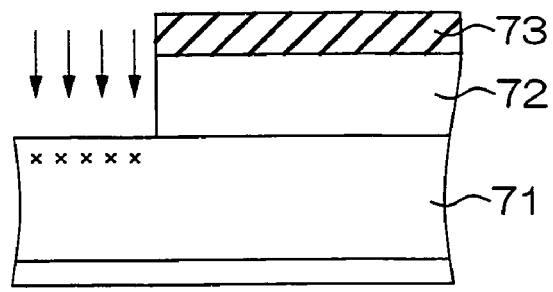
FIGS. 7A to 7O are schematic sectional views showing a process sequence for production of the semiconductor device of FIG. 6.
Figure 7B:
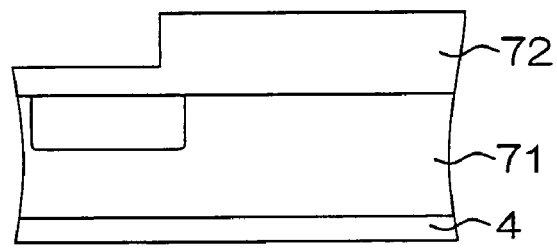
Figure 7C:
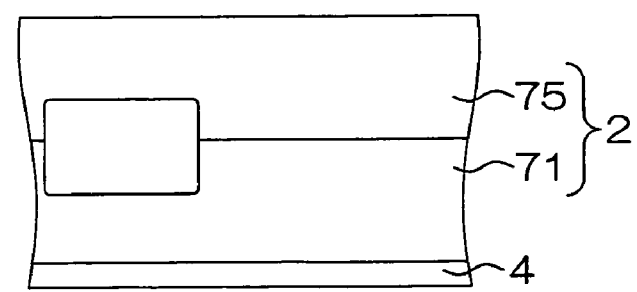
Figure 7D:
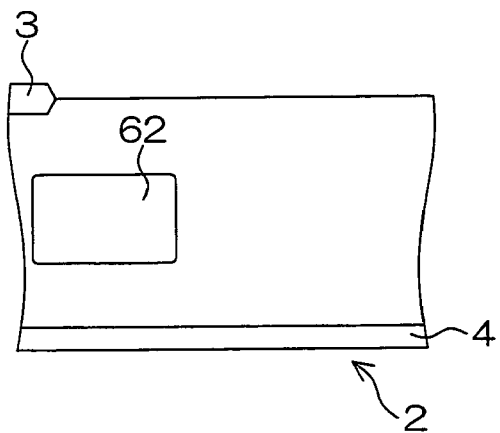
Figure 7E:
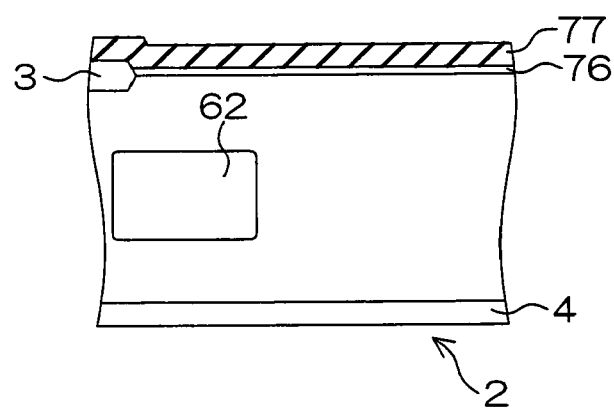
Figure 7F:
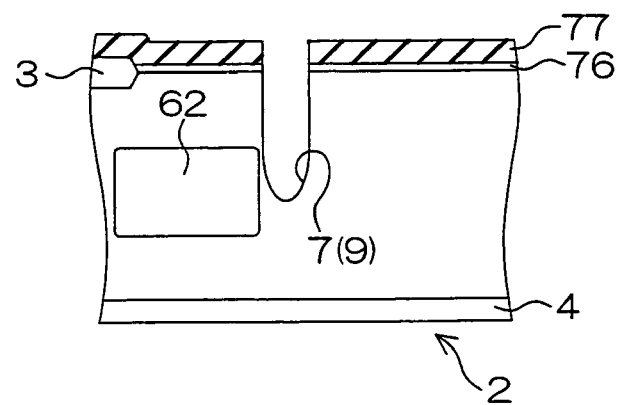
Figure 7G:
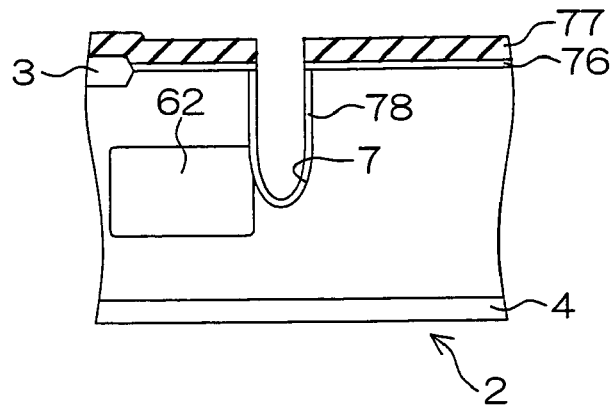
Figure 7H:
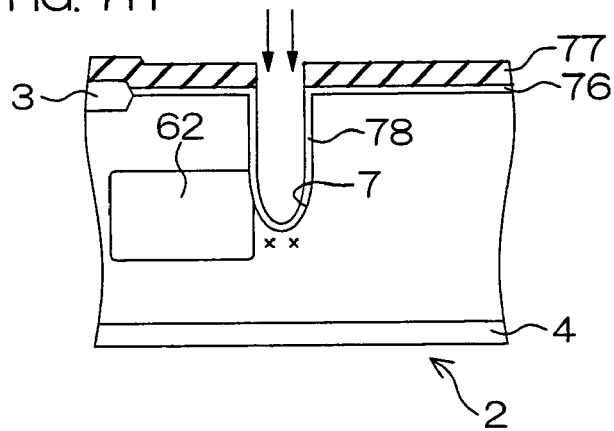
Figure 7I:
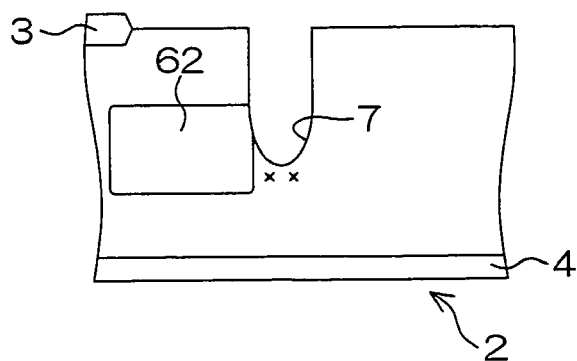
Figure 7J:
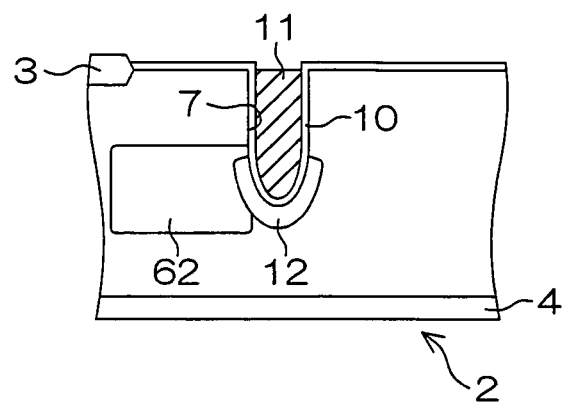
Figure 7K:
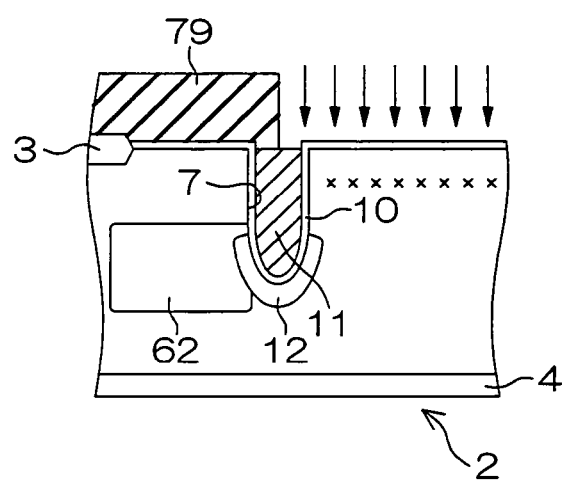
Figure 7L:
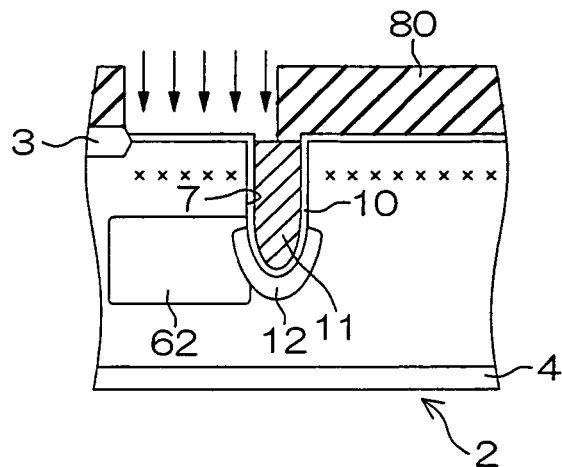
Figure 7M:
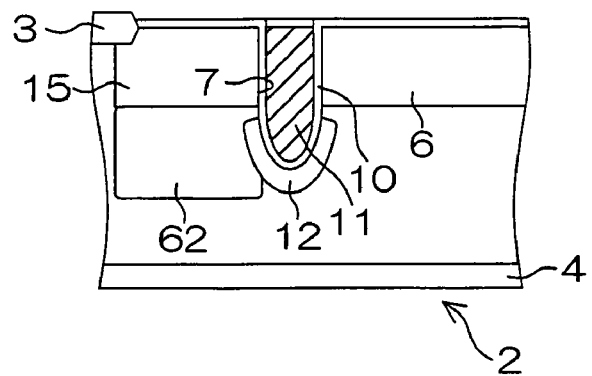
Figure 7N:
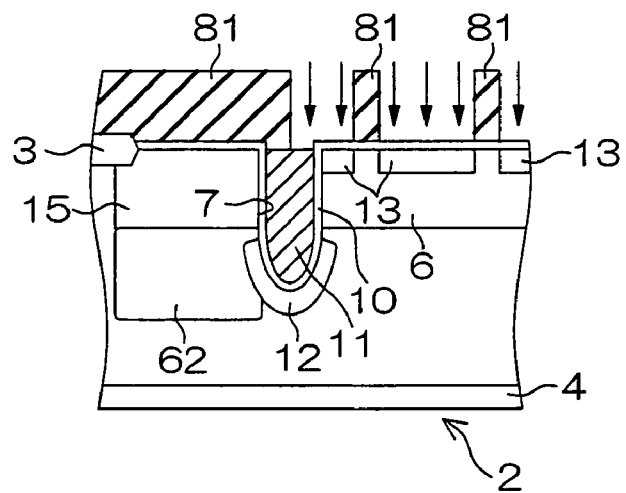
Figure 7O:
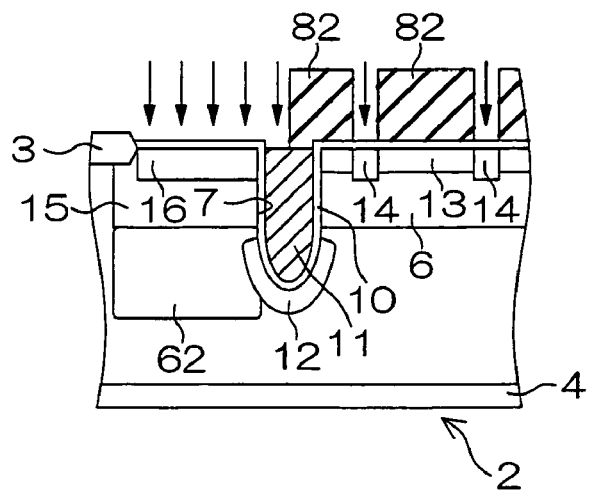
Figure 8A:
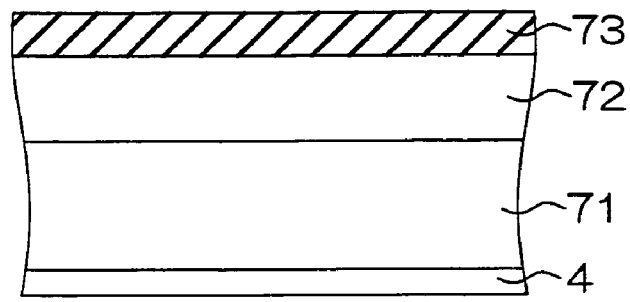
FIGS. 8A to 8O are schematic sectional views showing the process sequence for the production of the semiconductor device of FIG. 6.
Figure 8B:
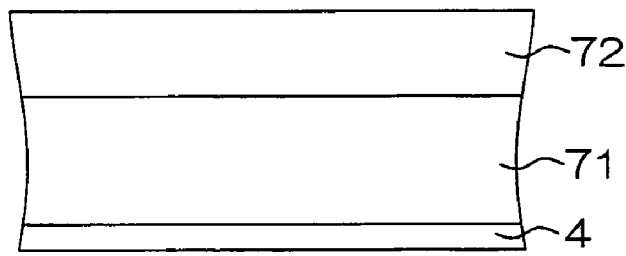
Figure 8C:
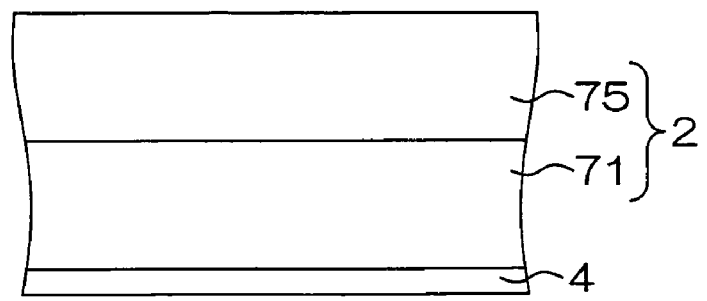
Figure 8D:
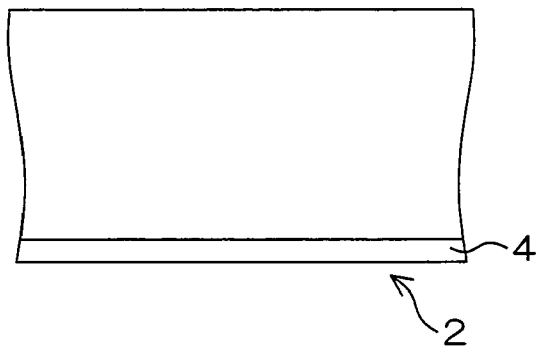
Figure 8E:
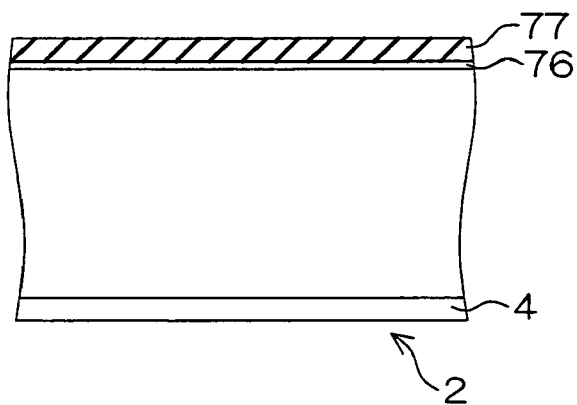
Figure 8F:
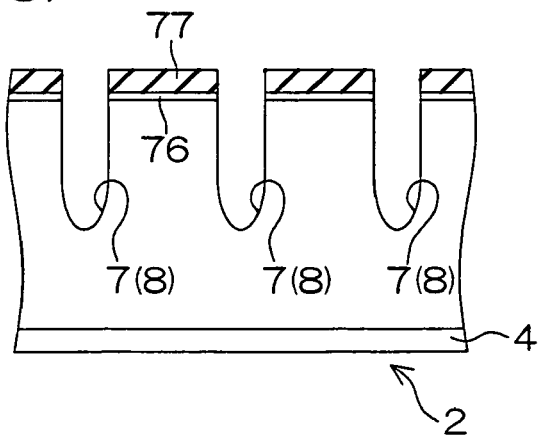
Figure 8G:
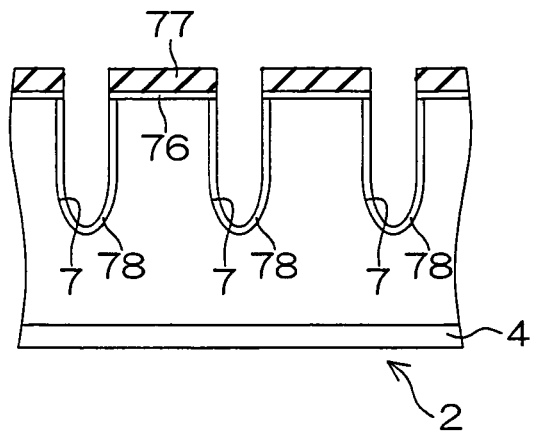
Figure 8H:
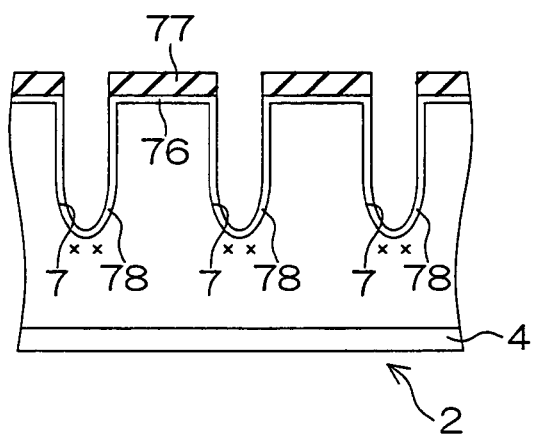
Figure 8:
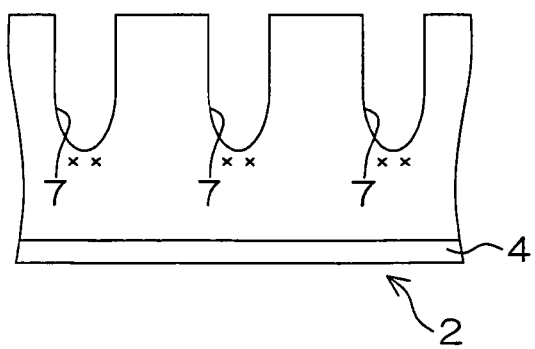
Figure 8J:
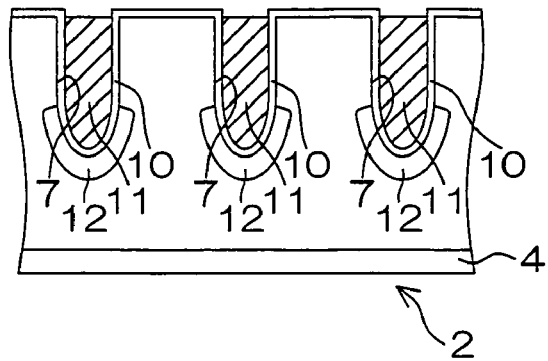
Figure 8K:
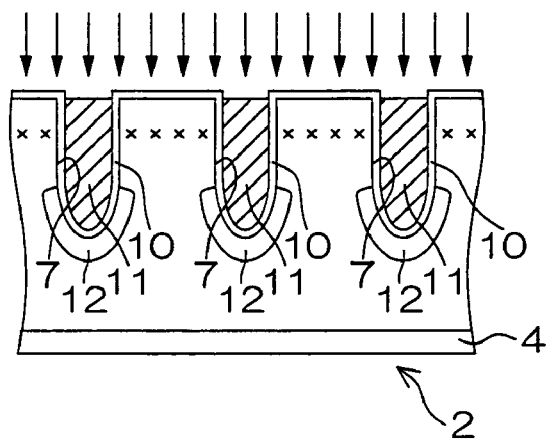
Figure 8L:
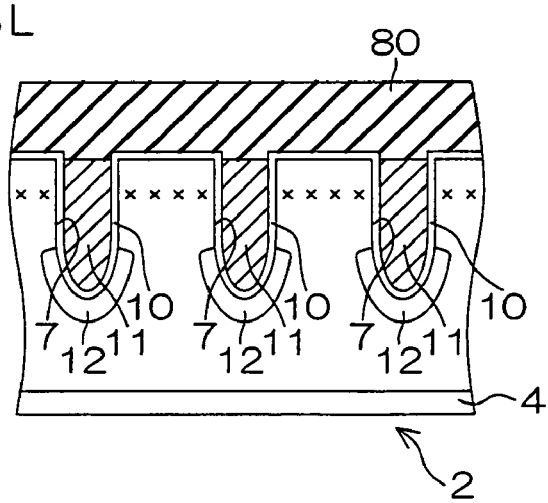
Figure 8M:
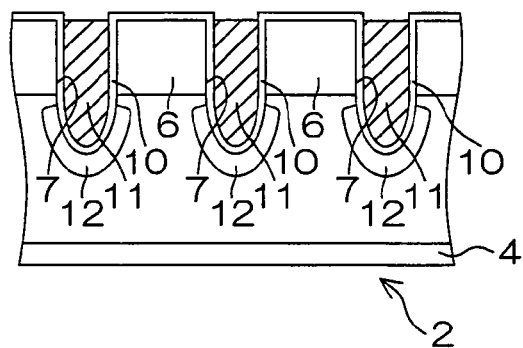
Figure 8N:
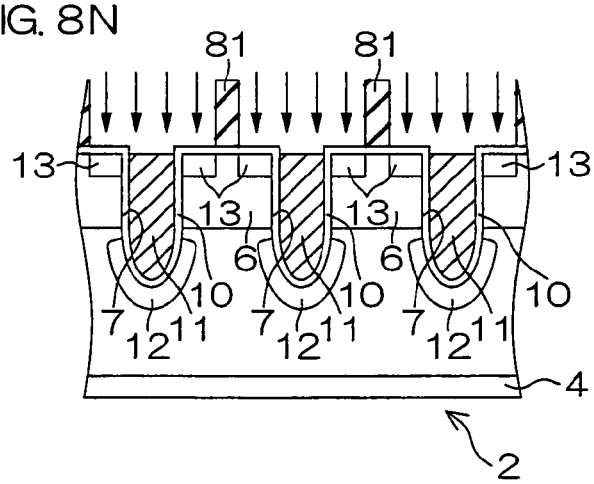
Figure 8O:
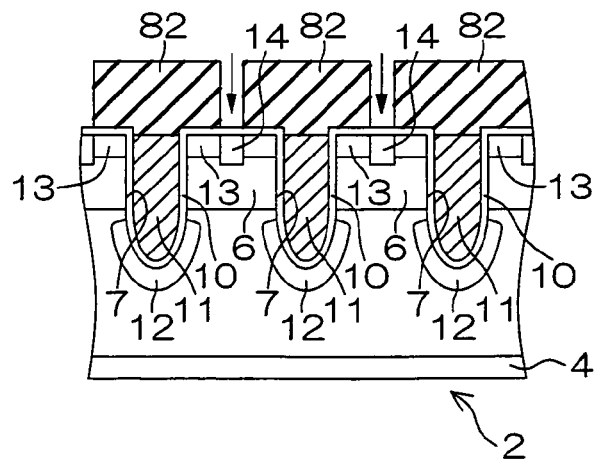

FIGS. 7A to 7O and FIGS. 8A to 8O are schematic sectional views showing a process sequence for production of the semiconductor device shown in FIG. 6. The sectional views of FIGS. 7A to 7O and FIG. 2 are taken along substantially the same sectional plane. The sectional views of FIGS. 8A to 8O and FIG. 3 are taken along substantially the same sectional plane.

In the production process for the semiconductor device 61, as shown in FIGS. 7A and 8A, an oxide film 72 of $SiO_2$ is formed in a surface of a semiconductor layer 71 of silicon having a drain region 4 provided in a bottom portion thereof by a thermal oxidation method. Then, a resist pattern 73 is formed on the oxide film 72 by photolithography. In turn, a portion of the oxide film 72 exposed from the resist pattern 73 is etched away, whereby the semiconductor layer 71 is partly exposed. Then, a P-type impurity is implanted into the exposed portion of the semiconductor layer 71 by an ion implantation method employing the oxide film 72 and the resist pattern 73 as a mask.

In turn, a heat treatment is performed. The heat treatment diffuses the P-type impurity implanted into a region surrounded by the field oxide film 3 as shown in FIG. 7B. Further, an oxide film 74 is formed on the exposed portion of the semiconductor layer 71. The oxide film 74 is unified with the oxide film 72. The heat treatment causes no change in the section shown in FIG. 8B.

Thereafter, the oxide films 72, 74 are etched away with the use of HF (hydrofluoric acid). Then, as shown in FIGS. 7C and 8C, an epitaxial layer 75 of silicon doped with an N-type impurity is formed on the semiconductor layer 71 by an epitaxial growth method. At this time, the P-type impurity implanted into the semiconductor layer 71 is also diffused into the epitaxial layer 75. Thus, a buried impurity region 62 is formed in the semiconductor layer 71 and the epitaxial layer 75. The epitaxial layer 75 and the semiconductor layer 71 are unified with each other to cooperatively define a semiconductor layer 2.

Thereafter, as shown in FIG. 7D, a field oxide film 3 is formed in a surface of the semiconductor layer 2 by a LOCOS method. The field oxide film 3 is not present in the section shown in FIG. 8D.

Subsequently, as shown in FIGS. 7E and 8E, a pad oxide film 76 of $SiO_2$ is formed in the surface of the semiconductor layer 2 by a thermal oxidation method. Further, a nitride film 77 is formed on the pad oxide film 76 by an LPCVD method.

In turn, as shown in FIGS. 7F and 8F, the pad oxide film 76 and the nitride film 77 are selectively removed by a photolithography and etching process. Then, a part of the semiconductor layer 2 is etched away by employing the pad oxide film 76 and the nitride film 77 as a mask, whereby a trench 7 is formed.

Thereafter, as shown in FIGS. 7G and 8G, a sacrificial oxide film 78 of $SiO_2$ is formed on an interior surface of the trench 7 by a thermal oxidation method. The pad oxide film 76 and the nitride film 77 are not removed but remain.

Then, as shown in FIGS. 7H and 8H, a P-type impurity is implanted into a portion of the semiconductor layer 2 around a bottom of the trench 7 through the trench 7 by an ion implantation method employing the pad oxide film 76 and the nitride film 77 as a mask.

In turn, as shown in FIGS. 7I and 8I, the sacrificial oxide film 78, the nitride film 77 and the pad oxide film 76 are removed in this order.

Then, as shown in FIGS. 7J and 8J, an oxide film of $SiO_2$ is formed in a surface of the semiconductor layer 2 including an interior surface of the trench 7 by a thermal oxidation method. A part of the oxide film present on the interior surface of the trench 7 serves as a gate insulation film 10. At this time, a heat treatment for the thermal oxidation diffuses the P-type impurity implanted into the semiconductor layer 2 to form a first impurity region 12 around the bottom of the trench 7. Thereafter, a doped polysilicon is deposited over the semiconductor layer 2 by CVD so as to fill the trench 7. Then, the deposited doped polysilicon is etched back to form a gate electrode 11 in the trench 7 with the intervention of the gate insulation film 10.

After the formation of the gate electrode 11, as shown in FIGS. 7K and 8K, a resist pattern 79 having an opening through which a center portion of a region surrounded by the field oxide film 3 is selectively exposed is formed. Then, a P-type impurity is implanted into the center portion of the region surrounded by the field oxide film 3 by an ion implantation method employing the resist pattern 79 as a mask. After the implantation of the P-type impurity, the resist pattern 79 is removed.

In turn, as shown in FIGS. 7L and 8L, a resist pattern 80 having an opening through which a peripheral portion of the region surrounded by the field oxide film 3 is selectively exposed is formed. Then, a P-type impurity is implanted into the peripheral portion of the region surrounded by the field oxide film 3 by an ion implantation method employing the resist pattern 80 as a mask. At this time, the dose of the P-type impurity is greater than the dose of the P-type impurity implanted into the center portion of the region surrounded by the filed oxide film 3. After the implantation of the P-type impurity, the resist pattern 80 is removed.

In turn, a heat treatment is performed to diffuse (drive) the P-type impurity implanted into the region surrounded by the field oxide film 3. By the diffusion of the P-type impurity, as shown in FIGS. 7M and 8M, a body region 6 is formed in the center portion of the region surrounded by the field oxide film 3 in the semiconductor layer 2, and a second impurity region 15 is formed in the peripheral portion of the region surrounded by the field oxide film 3 in the semiconductor layer 2.

Thereafter, as shown in FIGS. 7N and 8N, a resist pattern 81 is formed on the semiconductor layer 2. Then, an N-type impurity is implanted into a portion of the semiconductor layer 2 exposed from the resist pattern 81 by an ion implantation method employing the resist pattern 81 as a mask. Thus, a source region 13 is formed. After the implantation of the N-type impurity, the resist pattern 81 is removed.

Further, as shown in FIGS. 7O and 8O, a resist pattern 82 is formed on the semiconductor layer 2. Then, a P-type impurity is implanted into portions of the semiconductor layer 2 exposed from the resist pattern 82 by an ion implantation method employing the resist pattern 82 as a mask. Thus, body contact regions 14 and a contact region 16 are formed. After the implantation of the P-type impurity, the resist pattern 82 is removed.

Thereafter, an interlayer dielectric film is formed on the semiconductor layer 2, and plugs 17, 18, a source interconnection 19 and a drain interconnection 20 are formed. Thus, the semiconductor device 61 shown in FIG. 6 is obtained.

The production method according to this embodiment is directed to a case in which the P-type impurity concentration of the second impurity region 15 is higher than the P-type impurity concentration of the body region 6 by way of example. Where the body region 6 and the second impurity region 15 have the same P-type impurity concentration, the step shown in FIGS. 7K and 8K may be combined with the step shown in FIGS. 7L and 8L to implant the P-type impurity into the entire surface of the semiconductor layer 2 without the formation of the resist patterns 79 and 80.

While two embodiments of the present invention have thus been described, these embodiments may be modified in various ways within the scope of the appended claims.

For example, the conductivity types (the P-type and the N-type) of the semiconductor portions may be reversed in the semiconductor devices 1 and 61.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2008-273551 filed in the Japan Patent Office on Oct. 23, 2008, the disclosure of which is incorporated herein by reference.

What is claimed is:

1. A semiconductor device comprising:
   a semiconductor layer;
   a drift region of a first conductivity type provided in the semiconductor layer;
   a body region of a second conductivity type provided on the drift region in the semiconductor layer;
   a trench extending from a surface of the body region in the semiconductor layer with its bottom located in the drift region;
   a gate insulation film provided on an interior surface of the trench;
   a gate electrode provided in the trench with the intervention of the gate insulation film;
   a source region of the first conductivity type provided in a surface layer portion of the body region;
   a first impurity region of the second conductivity type provided around the bottom of the trench in spaced relation from the body region; and
   a second impurity region of the second conductivity type provided on a lateral side of the body region in the semiconductor layer, the second impurity region being isolated from the body region and electrically connected to the first impurity region.

2. The semiconductor device according to claim 1, wherein the second impurity region extends from a surface of the semiconductor layer to a depth such as to reach the first impurity region.

3. The semiconductor device according to claim 1, wherein the second impurity region has the same depth as the body region,
   the semiconductor device further comprising a buried impurity region of the second conductivity type provided below the second impurity region and connected to the first impurity region and the second impurity region.

4. The semiconductor device according to claim 1, wherein the second impurity region is looped so as to surround the body region.

5. The semiconductor device according to claim 1, wherein the trench includes a plurality of parallel portions which extend parallel to each other in a predetermined direction, and a connection portion which extends perpendicularly to the predetermined direction and connects one-end portions of the respective parallel portions.

6. The semiconductor device according to claim 5, further comprising:
   a plug connected to a surface of the second impurity region; and
   an interconnection connected to the plug.

7. The semiconductor device according to claim 6, wherein the plug includes a plurality of plugs arranged in spaced relation in a direction in which the connection portion extends, and the interconnection is connected commonly to the plurality of plugs.

8. The semiconductor device according to claim 6, further comprising a contact region provided in a surface layer portion of the second impurity region and having a higher impurity concentration than the second impurity region.

9. The semiconductor device according to claim 8, wherein the second impurity region is looped so as to surround the body region.

10. The semiconductor device according to claim 5, further comprising a body contact region provided in the surface layer portion of the body region as extending thicknesswise through the source region and having a higher impurity concentration than the body region.

11. The semiconductor device according to claim 10, wherein the body contact region includes a plurality of body contact regions arranged in spaced relation in a direction in which the parallel portions extend.

12. The semiconductor device according to claim 11, further comprising:

a plurality of source plugs provided in association with the respective body contact regions and each connected to the corresponding body contact region and a part of the source region around the body contact region; and a source interconnection connected commonly to the plurality of source plugs.

* * * * *